United States Patent [19]

Sariciftci et al.

[11] Patent Number: 5,331,183
[45] Date of Patent: Jul. 19, 1994

[54] CONJUGATED POLYMER - ACCEPTOR HETEROJUNCTIONS; DIODES, PHOTODIODES, AND PHOTOVOLTAIC CELLS

[75] Inventors: N. S. Sariciftci; Alan J. Heeger, both of Santa Barbara, Calif.

[73] Assignee: The Regents of the University of California, Oakland, Calif.

[21] Appl. No.: 930,161

[22] Filed: Aug. 17, 1992

[51] Int. Cl.$^5$ ............................................. H01L 29/28
[52] U.S. Cl. ..................................... 257/40; 257/184; 257/461; 136/263
[58] Field of Search .......................... 257/40, 184, 461; 365/215; 136/263

[56] References Cited

U.S. PATENT DOCUMENTS 5,171,373 12/1992 Hebard et al. ..................... 257/40

OTHER PUBLICATIONS

Kamat, P. "Photoinduced Charge Transfer Between Fullerenes and Semiconductor ZnO Colloids" J. Am. Chem. Soc., 1991, 113, pp. 9705-9707.

Wang, Y. "Photoconductivity of Fullerene-Doped Polymers" Nature, Apr. 16, 1992, pp. 585-587.

Arbogast, J. W., et al., "Photophysical Properties of $C_{60}$" J. Phys. Chem., Jan. 10, 1991, pp. 11-12.

Sze, M. S., *Physics of Semiconductor Laser Devices*, (1981) Wiley-Interscience, New York, Chapter 13, "Photodetectors" pp. 743-789.

Sze, M. S., *Physics of Semiconductor Laser Devices*, (1981) Wiley-Interscience, New York, Chapter 14, "Solar Cells" pp. 790-838.

*Primary Examiner*—Sara W. Crane
*Attorney, Agent, or Firm*—Morrison & Foerster

[57] ABSTRACT

This invention relates generally to the fabrication of heterojunction diodes from semiconducting (conjugated) polymers and acceptors such as, for example, fullerenes, particularly Buckminsterfullerenes, $C_{60}$, and more particularly to the use of such heterojunction structures as photodiodes and as photovoltaic cells.

15 Claims, 3 Drawing Sheets

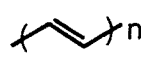
POLYACETYLENE
(PA)
FIG._1A
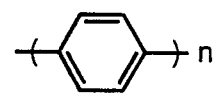
POLYPARAPHEMYLENE
(PPP)
FIG._1B
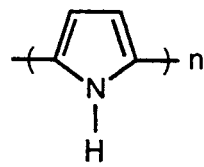
POLYPYRROLE
(PP)
FIG._1C
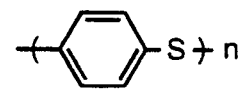
POLYPARAPHEMYLENE
SULPHIDE
(PPS)
FIG._1D
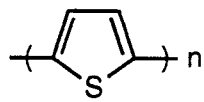
POLYTHIOPHENE
(PT)
FIG._1E
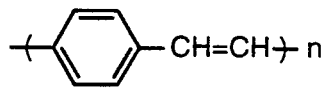
POLYPARAPHEMYLENE
VINYLENE
(PPV)
FIG._1F
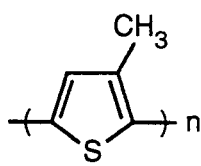
POLY-3 METHYL
THIOPHENE
(P3MT)
FIG._1G
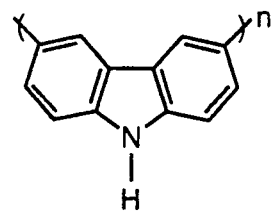
POLYCARBAZOLE
(PCB)
FIG._1H
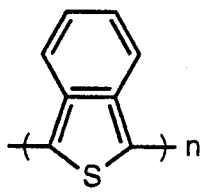
POLYISOTHIANAPHENE
(PITN)
FIG._1I
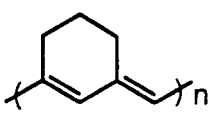
POLY(1,6-HEPTADIYNE)
(PHT)
FIG._1J

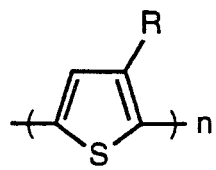
POLY-3 ALKYLTHIOPHENE
*FIG._1K*   R = BUTYL --> P3BT
R = ETHYL --> P3ET
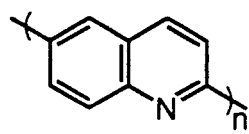
*FIG._1L*   POLYQUINOLINE
(PQ)
POLY-3 ALKYLSULFONATE
R' = CH$_2$CH$_2$SO$_3$Na
(P3ETSNa)
R' = (CH$_2$)$_4$SO$_3$Na
(P3BTSNa)
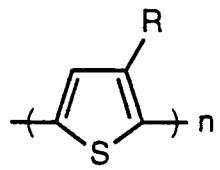
*FIG._1M*
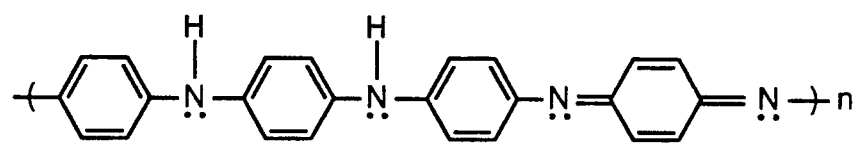
*FIG._1N*   POLYANILINE
(PANI)

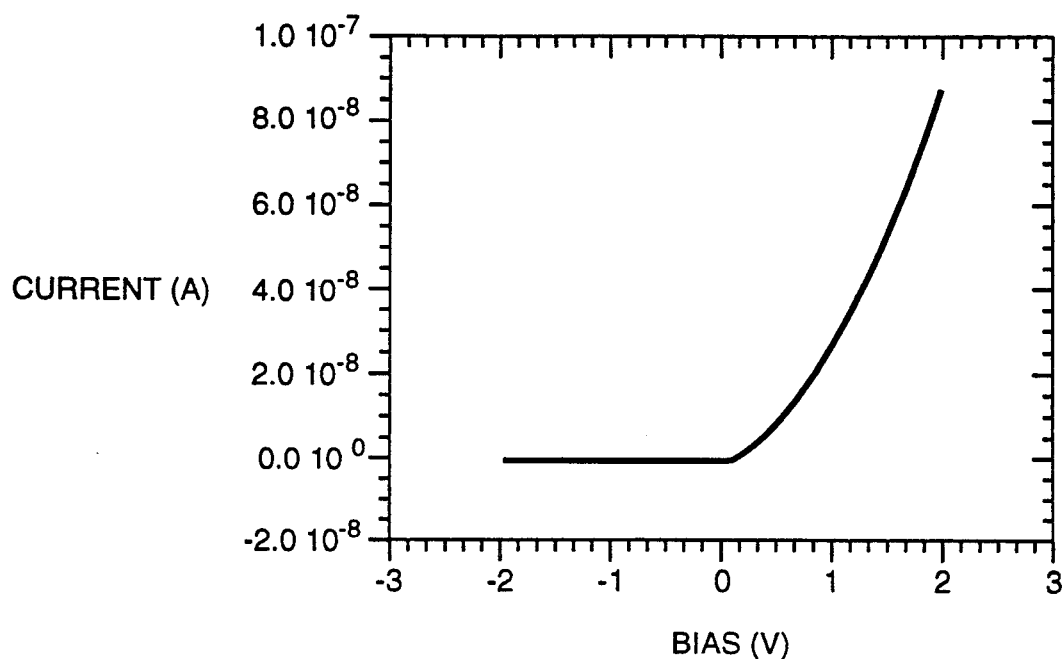
FIG._2A
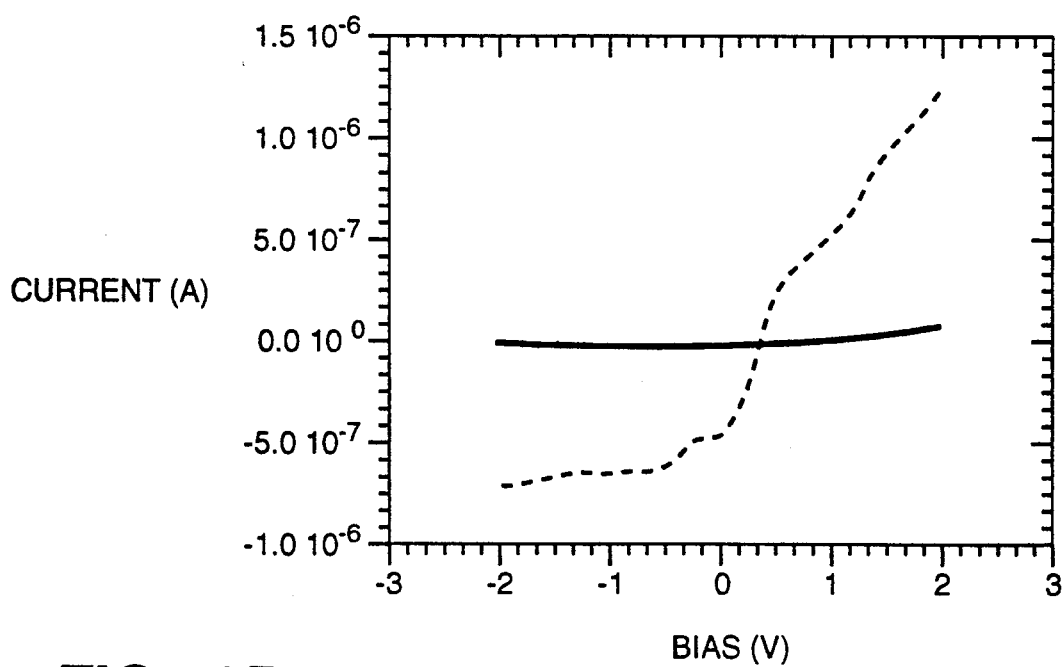
FIG._2B

CONJUGATED POLYMER - ACCEPTOR HETEROJUNCTIONS; DIODES, PHOTODIODES, AND PHOTOVOLTAIC CELLS

FIELD OF THE INVENTION

This invention relates generally to the fabrication of heterojunction diodes from semiconducting (conjugated) polymers and acceptors such as, for example, fullerenes, particularly Buckminsterfullerenes, $C_{60}$, and more particularly to the use of such heterojunction structures as photodiodes and as photovoltaic cells.

BACKGROUND OF THE INVENTION

Solid-state heterojunctions (between p-type and n-type semiconductors) have found widespread application in modern electronics. Such pn heterojunctions typically exhibit diode rectification; they are therefore, useful in a wide variety of electronic circuit applications. The pn heterojunction is useful as a single electronic element, and it is often part of more complex electronic elements such as transistors. A principal feature of the pn heterojunction is the built-in potential at the interface between the p-type (donor) material and the n-type (acceptor) material. This built-in potential arises fundamentally from the different electronegativities of the two materials which make up the heterojunction. The built-in potential and the associated difference in electronegativities is the origin of the rectifying nature of the device. When electrons and holes are photogenerated in the vicinity of the junction, the built-in potential and the associated difference in electronegativities serve to separate the charge. The charge separation at the interface is, therefore, the origin of the photovoltaic effect. Such pn heterojunction diodes can serve as photodiodes and as the fundamental element in a photovoltaic cell, commonly known as a solar cell.

There is extensive prior art on solar cells; such devices are commonly treated in standard texts on semiconductor devices (see for example M. S. Sze, *Physics of Semiconductor Devices*, Wiley-Interscience, New York, 1981; Chapters 13 and 14 ). Currently, solar cells are typically fabricated from conventional semiconductors; for example, gallium arsenide, silicon, cadmium sufide etc. Since these materials require costly high temperature processing steps, solar cells made from such materials enjoy limited use. In order to obtain optimum performance from such solar cells, single crystal materials are needed. The growth and the subsequent processing of single crystals is demanding, and therefore even more costly.

In photosynthesis in green plants, the process of charge separation is relatively efficient. There has, therefore, been longstanding interest in striving for a deeper understanding of charge separation in organic systems with the goal of achieving highly efficient charge separation following photo-excitation; see for example Marye Anne Fox and Michel Chanon, Eds., *Photoinduced Electron Transfer, Parts A D,* (Elsevier Science Publ., Amsterdam, 1988)

For the above reasons, there has been considerable interest for many years in the development of suitable organic materials for use as the p-type and n-type materials in pn junctions for device application.

The utilization of semiconducting organic polymers (i.e. conjugated polymers) in the fabrication of pn heterojunctions expands the possible applications for conducting polymers into the area of active electronic devices with the possibility of significant cost advantages over existing technology. Controlling the energy gap of the polymer, either through the judicious choice of the conjugated backbone structure or through side-chain functionalization, should make it possible to match the absorption spectrum of the conjugated polymer to the solar spectrum. The ability to make solar cells from uniform polymer layers which have with excellent mechanical properties (flexible films with large elongation to break) would enable robust large area devices that could be easily mounted for use.

Typically conjugated polymers are p-type materials in the as-synthesiszed form. Although such semiconducting polymers can be doped n-type (by addition of electrons into the high energy $\pi^*$ electronic energy levels) the resulting known n-type materials are often environmentally unstable.

There is no prior art on the use of conjugated polymers as donors in combination with fullerenes, such as Buckminsterfullerenes, as an acceptor to form donor-acceptor complexes which exhibit photoinduced charge transfer, photoinduced spectral changes (optical memory) and/or which lead to separation of charge and the photovoltaic effect at the interface between the two. There is no prior art using conjugated polymers as the donor layer and fullerenes, such as Buckminsterfullerenes, as the acceptor layer in a pn heterojunction that exhibits the photovoltaic effect.

The fundamental phenomenon underlying the photovoltaic effect is the process of charge separation viewed from the molecular level. A basic description of intramolecular and/or intermolecular photoinduced electron transfer is as follows:

SCHEME 1

Step 1: $D + A \rightarrow {}^{1,3}D^* + A$, (excitation on D);

Step 2: ${}^{1,3}D^* + A \rightarrow {}^{1,3}(D-A)^*$, (excitation delocalized on D-A complex);

Step 3: ${}^{1,3}(D-A)^* \rightarrow {}^{1,3}(D^{\delta+} - A^{\delta-})^*$, (charge transfer initiated);

Step 4: ${}^{1,3}(D^{\delta+} - A^{\delta})^* \rightarrow {}^{1,3}(D^{+\cdot} - A^{-\cdot})$, (ion radical pair formed);

Step 5: ${}^{1,3}(D^{+\cdot} - A^{-\cdot}) \rightarrow D^{+\cdot} + A^{-\cdot}$, (charge separation);

where:
  donor (D) and acceptor (A) units are either covalently bound (intramolecular), or spatially close but not covalently bonded (intermolecular);
  "1,3" denote singlet or triplet excited states.

At each step, the D-A system can relax back to the ground state either by releasing energy to the "lattice" (in the form of heat) or through light emission (provided the radiative transition is allowed). Permanent changes which may occur from ion radical reactions beyond Step 5 are not considered here. The electron transfer (Step 4) describes the formation of an ion radical pair; this does not occur unless $$I_{D^*} - A_A - U_C < 0,$$

where $I_{D^*}$ is the ionization potential of the excited state ($D^*$) of the donor, $A_A$ is the electron affinity of the acceptor, and $U_C$ is the Coulomb energy of the separated radicals (including polarization effects). Stabilization of the charge separation (Step 5) is difficult; typically the ion-radical pair recombines prior to charge separation so that no current could be delivered to an external circuit.

Thus, the ability to fabricate pn heterojunction diodes from organic materials and in particular from polymers, remains seriously limited.

SUMMARY OF THE INVENTION

This invention is a pn heterojunction diode fabricated using semiconducting polymers as the donor (p-type) layer and fullerenes, such as Buckminsterfullerenes, as the acceptor (n-type) layer.

This invention utilizes the processing advantages associated with the fabrication of said pn heterojunction diode structures from soluble semiconductor (conjugated) polymers (and/or their precursor polymers), as donors, cast from solution to enable the fabrication of large active areas.

This invention includes compositions useful as photovoltaic cells which are fabricated from semiconducting (conjugated) polymers as donors and Buckminsterfullerenes as acceptors and using flexible organic polymer substrates.

A further variation of this invention includes photovoltaic cells fabricated from semiconducting (conjugated) polymers as donors and semiconducting polymers as acceptors, where the acceptor polymers comprise fullerenes, such as Buckminsterfullerenes, where they are either mixed into a carrier polymer or covalently bonded to a polymer.

This invention also provides a means for obtaining charge separation for use in molecular information storage and optoelectronics. In this implementation, donor-acceptor pairs serve as bistable 'molecular information storage units', in which the separated ion radical pair state is visualized as one state (denoted as '1' in a base 2 representation) and the ground state is the second state (denoted as '0').

In one aspect of the invention, we show that by using composites made from conjugated polymers and $C_{60}$, that photoexcitation of the conjugated polymer with light of energy greater than the $\pi$-$\pi$* gap results in the initiation of electron transfer to the $C_{60}$ molecule. Photoinduced optical absorption studies demonstrate a different excitation spectrum for the composite compared to the separate components, consistent with photoexcited charge transfer. A photoinduced electron spin resonance signal exhibits signatures of both the conducting polymer cation and the $C_{60}$ anion. Since the photoluminescence in the conducting polymer is quenched by interaction with $C_{60}$, the data imply that charge transfer from the excited state occurs on a picosecond time scale. This fundamental demonstration of charge separation provides the basis for pn heterojunction devices which cause charge separation subsequent to photoexcitation. Heterojunction solar cells using this charge separation process have been demonstrated with devices fabricated from conjugated polymers and Buckminsterfullerene.

Specific advantages of this invention over the prior art include the following:

(i) Because the semiconducting conjugated polymer (or its precursor polymer) and the fullerenes are soluble, there is no need for heat treatment at elevated temperatures. This greatly simplifies the fabrication procedure and enables a continuous manufacturing process.

(ii) Since the semiconducting polymer layer and the fullerene can be cast onto the substrate directly from solution at room temperature, the device structure may be fabricated on a flexible transparent polymer substrate. Since such polymer films are manufactured as large area continuous films, the use of flexible polymer films as substrate enables the fabrication of large area polymer solar cells using either a batch process or a continuous process.

BRIEF DESCRIPTION OF THE DRAWINGS

FIGS. 1A to 1N show examples from the class of conjugated (semiconducting) polymers.

FIG. 2a shows a current vs voltage characteristic with conducting polymer $C_{60}$ junction device in the dark.

FIG. 2b shows a current vs voltage characteristic with conducting polymer-$C_{60}$ junction device (area of 0.1 cm$^2$) in the dark (solid curve) and illuminated with approximately 15 mW/cm$^2$.

DESCRIPTION OF THE INVENTION

The discovery of conducting polymers and the ability to dope these polymers over the full range from insulator to metal has resulted in the creation of a class of new materials which combine the electronic and optical properties of semiconductors and metals with the attractive mechanical properties and processing advantages of polymers [A. J. Heeger, S. Kivelson, J. R. Schrieffer, W. P. Su, *Review of Modern Physics.* 60, 781 (1988)]. Moreover, the ability to control the energy gap and electronegativity through molecular design has enabled the synthesis of conducting polymers with a range of ionization potentials and electron affinities; See T. A. Skotheim, Ed., *Handbook of Conducting Polymers* Vol. I, II (Marcel Dekker, New York 1986), J. L. Bredas and R. R. Chance, Eds., *Conjugated Polymeric Materials: Opportunities in Electronics, Optoelectronics and Molecular Electronics* (Kluwer Academic Press, Netherlands 1990. The unique combination of electrical, optical, electrochemical, and mechanical properties of these synthetic metals and semiconductors, plus the ability to expand the class of materials and control their properties through rational chemical synthesis has made conjugated polymers a promising field of interdisciplinary research.

By "conjugated polymers", we mean to include all $\pi$-electron semiconducting polymers. Typical examples include, but are not limited to, those shown in FIG. 1. Preferred is the conjugated polymer, poly(2-methoxy,5-(2'-ethyl-hexyloxy)-p-phenylene vinylene), hereafter referred to as MEH-PPV. Any conjugated polymer or conjugated oligomer could be used in place of MEH-PPV. For example, preliminary experiments on ($\beta$-carotene)-$C_{60}$ composites indicate photoinduced charge transfer. For solar cell applications, the conjugated system is chosen such that the absorption profile (absorption vs. wavelength) matches to the solar spectrum. For photodiode applications, the conjugated system is chosen such that the absorption profile is well matched to the wavelength to be detected.

Note that in FIG. 1, the polymer known as polyquinoline is an exception. Whereas all the other example polymers in FIG. 1 are known to be p-type (donors), polyquinoline is an acceptor polymer [*Handbook of Conducting Polymers*, T. A. Skotheim, Ed., (Marcel Dekker, New York 1986)].

As a new form of carbon, Buckminsterfullerene, $C_{60}$, has generated considerable recent interest in the scientific community; H. W. Kroto, R. J. Heath, S. C. O'Brien, R. F. Curl, R. E. Smalley, *Nature* 318, 165 (1985);

W. Kratschmer, L. D. Lamb, K. Fostiropoulos, D. R. Huffman, *Nature* 347, 354 (1990); H. W. Kroto, A. W. Allaf, S. P. Balm, *Chem. Rev.* 91 1213 (1991), and references cited therein. Fullerenes, including $C_{60}$, are excellent electron acceptors capable of taking on as many as six electrons; P. M. Allemand et al., *J. Am. Chem. Soc.* 113, 1050 (1991). $C_{60}$, therefore, forms charge transfer salts with a variety of strong donors. The discovery of important solid state properties in such charge transfer salts of $C_{60}$ has opened exciting new directions of research activity; examples include the metallic state and superconductivity in salts with alkali metal ions, and soft ferromagnetism in an organic salt with $(C_{60})^{-}$.

The "fullerenes" have been expanded into a growing class of structures, including (for example) distorted "bucky balls", $C_{70}$, chemically substituted bucky balls, bucky tubes, etc. When using fullerenes as acceptors, only the fullerene moiety is required. Buckminsterfullerene, $C_{60}$, is desired. Other acceptors with comparable electronegativity could be used in place of $C_{60}$. For example, preliminary experiments on MEH-PPV-polquinoline (see FIG. 1) composites have demonstrated diode formation and photovoltaic response. Other acceptors could also be used, either in molecular form or covalently bonded to a polymer chain; possible examples include tetracyanoquinodimethane (TCNQ) and other organic acceptors that can take on an extra electron into the $\pi$-electron system to form the anion. The principal requirement is the electronegativity of the acceptor: the electronegativity must be sufficient that Steps 1 through 5 of Scheme 1 proceed as indicated. Thus, the acceptor must not be so highly electronegative that charge transfer is stabilized in the ground state, but it must be sufficient to cause charge transfer and charge separation subsequent to photoexcitation of the donor.

In essence, therefore, the present invention involves four steps:

1) The heterojunction desirably is built upon a substrate, for example, a piece of glass, metal, ceramic polymer or any mechanically suitable material. If the substrate material is not conducting, a conducting electrode layer must be applied to serve as one contact to the heterojunction bilayer. Possible conducting layers for said contact are metal layers, conducting layers made from mixed oxides (such as indium/tin oxide) and conducting polymer layers (such as polyaniline or conducting polyblends of polyaniline).

2) The conjugated polymer (or its precursor) is cast directly from solution onto the substrate. The thickness of the conjugated polymer layer should be adjusted to enable light absorption near the interface between the conjugated polymer and the fullerene, whether that interface is smooth (as would be the case for sequential application one after the other) or if the interface is complex (as would be the case in a phase separated composite where the interface might have a surface area much greater than the nominal surface area of the device).

3) The fullerene layer (and pure fullerene, pure Buckminsterfullerene, fullerene derivatives, Buckminsterfullerene derivatives, or polymers comprising fullerenes, Buckminsterfullerene, or an alternative acceptor with comparable electronegativity) serves as the acceptor layer. Again, the thickness of the fullerene (or alternative acceptor) layer is adjusted to enable light absorption near the interface between the conjugated polymer and the acceptor, whether that interface is smooth (as would be the case sequentially applied thin films) or if the interface is complex (as would be the case in a phase separated composite where the interface might have a surface area much greater than the nominal surface area of the device).

4) A conducting electrode layer is applied, typically serving as a transparent contact to the heterojunction bilayer. Transparent conducting layers for said contact may be conducting layers made from mixed oxides (such as indium/tin oxide) and conducting polymer layers (such as polyaniline or conducting polyblends of polyaniline). For efficient photoinduced charge transfer, this upper contact desirably is either transparent or covers only a fraction of the area of the device which is exposed to the sunlight. Otherwise the incident light would be absorbed in the electrode rather than near the heterojunction interface.

EXAMPLES

The following examples show methods of carrying out the invention. They are intended to be examples and not to limit the invention as claimed below in any way.

Example 1

Thin films of a (MEH-PPV)-$C_{60}$ composite were prepared for optical studies by spin casting or drop casting from concentrated solutions onto quartz or sapphire substrates. The solutions were prepared by dissolving MEH-PPV and $C_{60}$ (1:1 by weight) in toluene at a total typical concentration of 6 mg per 0.3 ml.

Absorption spectra of the (MEH-PPV)-$C_{60}$ composite were recorded. The $\pi \rightarrow \pi^*$ absorption (peak at 2.5 eV) characteristic of MEH-PPV and the 3.7 eV transition of characteristic of $C_{60}$ are clearly observed; the spectrum is simply a linear superposition of the two.

This example shows that since there are no additional features in the absorption spectra, the composite can be regarded as D+A, where D=(MEH-PPV) and A=$C_{60}$, indicating no significant mixing of the electronic wave functions in the ground state.

Example 2

Thin films of the (MEH-PPV)-$C_{60}$ composite were prepared as in Example 1. The intense photoluminescence of MEH-PPV [T. W. Hagler, K. Pakbaz, K. Voss, and A. J. Heeger, *Phys. Rev. B* 44, 15 (1991)] is, however, almost completely quenched, implying a strong interaction of the two components in the excited state. The intensity of the emission spectrum of the (MEH-PPV)-$C_{60}$ composite is reduced by nearly three orders of magnitude in comparison with pure MEH-PPV. Independent measurements of the time decay of the photoluminescence demonstrated a reduction in the photoluminescent lifetime from approximately 550 ps in MEH-PPV to less than 60 ps (the pulse width of the excitation laser) in the (MEH-PPV)-$C_{60}$ composite. The quenching of the photoluminescence of MEH-PPV by interaction with $C_{60}$ implies that in the (MEH-PPV)-$C_{60}$ composite there exists a competitive process to the radiative emission of MEH-PPV, consistent with charge transfer from the $\pi^*$ band of the photo-excited MEH-PPV to $C_{60}$. An estimate of the transfer rate, $1/\tau_{ct}$, is given by decay rate of the photoluminescence in the (MEH-PPV)-$C_{60}$ composite (charge transfer will cut-off the radiative decay). Since the photoluminescence decay in the composite is unresolved within the 60 ps of the excitation pulse, we use the ratio of the intensities to estimate $1/\tau_{ct}$;

$$1/\tau_{ct} \sim (1/\tau_{rad})I_o/I_{comp}$$

where $1/\tau_{rad}$ is the radiative decay rate, $I_o$ and $I_{comp}$ are the integrated photoluminescence intensities of MEH-PPV and the (MEH-PPV)-$C_{60}$ composite, respectively. The data imply, therefore, that $1/\tau_{ct} \sim 10^{12}$; electron transfer occurs on a picosecond time scale.

This example shows that charge transfer occurs and that the charge transfer occurs on a picosecond time scale. The implication of this result is that the charge transfer process is faster than potentially competing mechanisms; thus implying that charge separation will occur with high efficiency. Such highly efficient charge separation is necessary for high efficiency in solar cells and for large signal response in photodiodes.

Example 3

Light-induced Electron Spin Resonance (LESR) experiments used a BRUKER 200D ESR spectrometer equipped with a variable temperature cryostat. For the LESR experiments, ESR tubes were filled with the same solutions as described in Example 1, dried under vacuum, and subsequently sealed. The sample was illuminated using an optical fiber to bring the output beam from an Argon ion laser (514.5 nm) into the microwave cavity. Steady state ESR spectra were recorded with the beam on and off, and compared.

Upon irradiation at 80K, two photoinduced spin signals were resolved; one at $g \approx 2.0000$ with $\Delta H_{pp} = 7.2G$, and the other at $g \approx 1.9955$ with $\Delta H_{PP} = 6G$. The higher g-value line is a signature of the (MEH-PPV)+ cation [checked independently] and the lower g-value line is a signature of the $(C_{60})^-$ anion [P. M. Allemand et al., *J. Am. Chem. Soc.* 113, 2780 (1991)]. At 80K, the intensity of the ESR signal increases during successive light on-off cycles, indicating memory and metastability with a long lifetime for the charge transferred state. At 200K, however, the LESR signal has nearly vanished, demonstrating the reversibility of the photoinduced electron transfer and ruling out permanent spins from photochemical reaction products.

This example provides definitive evidence of electron transfer; the g-value signatures of the(MEH-PPV)+ cation and the $(C_{60})^-$ anion.

Example 4

Thin films of the (MEH-PPV)-$C_{60}$ composite were prepared as in Example 1. The photoinduced changes in the absorption of the (MEH-PPV)-$C_{60}$ composite. Photoinduced changes in the absorption ($\alpha$) spectra were recorded by mechanically chopping the pump laser beam (2.41 eV) at 273 Hz and coherently detecting the resulting changes in transmission (T) with a lockin amplifier. The photoinduced absorption is directly calculated from the normalized changes in transmission ($-\Delta T/T \approx \delta \alpha d$, where d is the film thickness). With this method, the system response is automatically divided out; independent measurements were carried out to check for any contribution from luminescence emission to the photoinduced signal.

Photoinduced absorption (PIA) spectra were compared with those of MEH-PPV and $C_{60}$. A sharp PIA edge at 1.15 eV and a plateau around 1.8-2.1 eV distinguishes the composite from the pure MEH-PPV. The PIA band with peak near 1.35 eV observed in the composite is to be assigned to the excited state of MEH-PPV, either a triplet or a bipolaron (or polaron) configuration; [K. Voss et al., *Phys. Rev.* B43, 5109 (1991), L. Smilowitz, A. J. Heeger, *Synth. Metals* 48, 193 (1992)]. Since the first absorption of $C_{60}^-$ anion occurs at 1.1-1.2 eV [V. I. Srdanov et al., *Chem. Phys. Lett.* 192, 243 (1992)], the sharp PIA edge at 1.15 eV arises from the $C_{60}^-$ anion. The sharp turnover in the PIA spectrum of the (MEH-PPV)-$C_{60}$ composite at 2 eV (note that this is not due to photoluminescence) indicates a bleaching of the $\pi$-$\pi^*$ interband transition of MEH-PPV, consistent with charge transfer; similar bleaching is observed, for example, on p-type doping. The excitation profile of all the PIA features observed in the (MEH-PPV)-$C_{60}$ composite follow the absorption profile of pure MEH-PPV, demonstrating that the initial step in the photoinduced electron transfer from the conducting polymer onto $C_{60}$ is the $\pi$-$\pi^*$ absorption of MEH-PPV.

This example demonstrates photoinduced spectral changes, and therefore demonstrates the use of (MEH-PPV)-$C_{60}$ system as an optical memory unit: where addressed by a light beam the spectrum changes—these changes can be "read" by the changed transmission of a probe beam. The memory and metastability of the charge transferred state (see Example 4) demonstrate that the photoinduced spectral changes can be used for optical memory.

Example 5

Heterojunction devices (pn heterojunctions) were prepared by spinning MEH-PPV from xylene solution (1% by weight) onto ITO glass (the ITO, Indium/tin oxide, served as a transparent electrode to make contact to the MEH-PPV (Donor, p-type) layer). Typical thicknesses were approximately 1000 Å. The coated substrates were then mounted in an evaporation vacuum chamber, the system was pumped to high vacuum ($10^{-7}$ torr), and $C_{60}$ was evaporated onto the surface to a thickness of approximately 500 Å. The final contact (to the n-type acceptor layer, $C_{60}$) was either gold or aluminum (separate experiments). This final metal contact was again evaporated onto the $C_{60}$ layer in a vacuum evaporation chamber.

Current (I) vs voltage (V) curves were taken with the four-layer pn heterojunction in a controlled atmosphere dry box to avoid any surface oxidation or photooxidation. The I vs V curve, taken in the dark, is shown as FIG. 2a. The I-V curve is characteristic of diode behavior.

This Example demonstrates that the conducting polymer/$C_{60}$ junction acts as a pn junction to form a diode.

Example 6

Heterojunction devices (pn heterojunctions) were prepared by spinning MEH-PPV from xylene solution (1% by weight) onto ITO glass (the ITO, Indium/tin oxide, served as a transparent electrode to make contact to the MEH-PPV (Donor, p-type) layer). Typical thicknesses were approximately 1000 Å. The coated substrates were then mounted in an evaporation vacuum chamber, the system was pumped to high vacuum ($10^{-7}$ torr), and $C_{60}$ was evaporated onto the surface to a thickness of approximately 500 Å. The final contact (to the n-type acceptor layer, $C_{60}$) was either gold or aluminum (separate experiments). This final metal contact was again evaporated onto the $C_{60}$ layer in a vacuum evaporation chamber.

Current (I) vs voltage (V) curves were taken with the four-layer pn heterojunction (surface area of 0.1 cm$^2$) in a controlled atmosphere dry box to avoid any surface oxidation or photo-oxidation. The I vs V curve, taken in the dark is shown as the solid line in FIG. 2. The I-V curve taken with the heterojunction illuminated with white light (with intensity of approximately 15 mW/cm$^2$) is shown as the dashed curve in FIG. 2b. The deliverable power from this device was $$P = \tfrac{1}{4}(I_{sc}V_{oc})$$

where $I_{sc}$ and $V_{oc}$ are the short circuit current and the open circuit voltage, respectively. From the data one obtains $I_{sc} \approx 4 \times 10^{-7}$A and $V_{oc} \approx 0.2$ V, so that $P \approx 4 \times 10^{-7}$ Watts/cm$^2$.

Similar results were obtained in parallel using polyquinoline as the acceptor layer; both rectifying diode-like current vs voltage characteristics and photovoltaic response were observed with the MEH-PPV/polyquinoline heterojunction devices.

This Example demonstrates that the conducting polymer-C$_{60}$ junction acts as a rectifying junction to form a diode, and that the diode acts as a photodiode; for example, increased current flows when the diode is biased in the reversed direction. This Example also demonstrates that the conducting polymer-C$_{60}$ junction acts as a rectifying junction to form a diode, and that the diode acts as a photovoltaic cell (or solar cell) which can deliver electrical power to an external load. This Example also demonstrates that alternative acceptors can be used for the acceptor layer in the photodiode and photovoltaic devices.

Example 7

Heterojunction devices were prepared by spinning MEH-PPV from xylene solution (1% by weight) onto ITO glass (the ITO, Indium/tin oxide, served as a transparent electrode to make contact to the MEH-PPV (Donor, p-type) layer). Typical thicknesses were approximately 1000 Å. The coated substrates were then mounted in an evaporation vacuum chamber, the system was pumped to high vacuum (10$^{-7}$ torr), and C$_{60}$ was evaporated onto the surface. The final contact (to the n-type acceptor layer, C$_{60}$) was either gold or aluminum (separate experiments). This final metal contact was again evaporated onto the C$_{60}$ layer in a vacuum evaporation chamber.

The heterojunction device was put in reverse bias (1 volt) with the circuit closed by a 100 ohm resistor. The device was illuminated with light from the output of a monochromato, and the spectral response (current through the series resistor) was measured as a function of wavelength. The device operated as a photodiode detector for radiation with wavelengths throughout the visible and near IR portions of the spectrum (from 1.7 eV through 3.6 eV and above).

This example demonstrates the MEH-PPV/Buckminsterfullerene heterojunction operates as photodiode detector for wavelengths through the visible and near-IR portions of the electromagnetic spectrum.

Example 8

Heterojunction devices were prepared as in Example 7. The short circuit current, $I_{sc}$, and the open circuit voltage, $V_{oc}$, were measured as a function of the light intensity at a fixed wavelength.

It will be apparent to one having ordinary skill in this art that variations and equivalents to this invention (as claimed below) will be available. We intend the following claims to encompass those equivalents.

We claim as our Invention:

1. A heterojunction device comprising
   a. a layer of a conjugated polymer which serves as a donor, and adjacent thereto, a
   b. layer of an acceptor material comprising an acceptor selected from the group consisting of the group of fullerenes, substituted fullerenes, fullerene derivatives, polymers comprising fullerenes or substituted fullerenes or of organic or polymeric acceptors having electronegativity in the range to enable a photoinitiated charge separation process defined by the following steps:

Step 1: $D + A \rightarrow {}^{1,3}D^* + A$, (excitation on D);

Step 2: ${}^{1,3}D^* + A \rightarrow {}^{1,3}(D\text{---}A)^*$, (excitation delocalized on D-A complex);

Step 3: ${}^{1,3}(D\text{---}A)^* \rightarrow {}^{1,3}(D^{\delta+}\text{---}A^{\delta-})^*$, (charge transfer initiated);

Step 4: ${}^{1,3}(D^{\delta+}\text{---}A^{\delta-})^* \rightarrow {}^{1,3}(D^{+\cdot}\text{---}A^{-\cdot})$, (ion radical pair formed);

Step 5: ${}^{1,3}(D^{+\cdot}\text{---}A^{-\cdot}) \rightarrow D^{+\cdot} + A^{-\cdot}$, (charge separation);

where:
   donor (D) and acceptor (A) units are either covalently bound (intramolecular), or spatially close but not covalently bonded (intermolecular);

"1,3" denotes singlet or triplet excited states, respectively.

2. The heterojunction device of claim 1 where one or more of the layers is applied onto a substrate in fluid form either from solution or from the melt at temperatures below 3000° C.

3. A heterojunction device comprising
   a. a conjugated polymer which serves as a donor, and adjacent thereto,
   b. an acceptor material comprising an acceptor selected from the group consisting of fullerenes or fullerene derivatives, polymers comprising fullerenes or fullerene derivatives, organic and or polymeric acceptors having electronegativity in the range to enable a photoinitiated charge separation process defined by the following steps:

Step 1: $D + A \rightarrow {}^{1,3}D^* + A$, (excitation on D);

Step 2: ${}^{1,3}D^* + A \rightarrow {}^{1,3}(D\text{---}A)^*$, (excitation delocalized on D-A complex);

Step 3: ${}^{1,3}(D\text{---}A)^* \rightarrow {}^{1,3}(D^{\delta+}\text{---}A^{\delta-})^*$, (charge transfer initiated);

Step 4: ${}^{1,3}(D^{\delta+}\text{---}A^{\delta-})^* \rightarrow {}^{1,3}(D^{+\cdot}\text{---}A^{-\cdot})$, (ion radical pair formed);

Step 5: ${}^{1,3}(D^{+\cdot}\text{---}A^{-\cdot}) \rightarrow D^{+\cdot} + A^{-\cdot}$, (charge separation);

where
   donor (D) and acceptor (A) units are either covalently bound (intramolecular), or spatially close but not covalently bonded (intermolecular);

"1,3" denotes singlet or triplet excited states, respectively, and where a heterojunction between the conjugated polymer and acceptor material is formed in situ by controlled segregation during solidification from a solution containing both the donor and the acceptor moieties.

4. A heterojunction device comprising
   a. a conjugated polymer which serves as a donor, and adjacent thereto, b. an acceptor material comprising an acceptor selected from the group consisting of fullerenes or fullerenced derivatives, polymers comprising fullerences or fullerence derivatives, organic and or polymeric acceptors having electronegativity in the range to enable a photoinitiated charge separation process defined by the following steps:

Step 1: $D+A \rightarrow {}^{1,3}D^*+A$, (excitation on D);

Step 2: ${}^{1,3}D^*+A \rightarrow {}^{1,3}(D-A)^*$, (excitation delocalized on D-A complex);

Step 3: ${}^{1,3}(D-A)^* \rightarrow {}^{1,3}(D^{\delta+}-A^{\delta-})^*$, (charge transfer initiated);

Step 4: ${}^{1,3}(D^{\delta+}-A^{\delta-})^* \rightarrow {}^{1,3}(D^{+\cdot}-A^{-\cdot})$, (ion radical pair formed);

Step 5: ${}^{1,3}(D^{+\cdot}-A^{-\cdot}) \rightarrow D^{+\cdot}+A^{-\cdot}$, (charge separation);

where:

donor (D) and acceptor (A) units are either covalently bound (intramolecular), or spatially close but not covalently bonded (intermolecular);

"1,3" denotes singlet or triplet excited states, respectively, and where a heterojunction between the conjugated polymer and acceptor material is formed in situ by mixing two immiscible liquid constituents, one comprising the donor and the other comprising the acceptor and casting as a solid film.

5. The heterojunction device of any of claims 1 through 4 additionally comprising a contact electrode of a transparent film of polyaniline or a transparent conducting polyblend of polyaniline with an amorphous host polymer, where each two contacting electrodes comprising transparent films of polyaniline or transparent conducting polyblends of polyaniline with an amorphous host polymer.

6. The heterojunction device of any of claims 1 through 4 additionally comprising two contacting electrodes comprising transparent films of polyaniline or transparent conducting polyblends of polyaniline with an amorphous host polymer.

7. The heterojunction device of any of claims 1 through 4 where additionally comprising a solid inorganic crystalline or glassy substrate or polymer substrate precoated with a transparent electrode.

8. The heterojunction device of any of claims 1 through 4 additionally comprising solid inorganic crystalline or glassy substrate or polymer substrate precoated with a metal electrode.

9. The heterojunction device of any of claims 1 through 4 additionally comprising flexible polymer substrate precoated with a transparent flexible conducting polymer electrode.

10. The heterojunction device of any of claims 1 through 4 additionally comprising a flexible polymer substrate precoated with a flexible metal electrode.

11. The heterojunction device of any of claims 1 through 4 additionally comprising a first flexible polymer substrate contact precoated with a flexible metal electrode, and a second flexible conducting layer contact.

12. The heterojunction device of any of claims 1 through 4 additionally comprising a flexible polymer substrate contact precoated with a transparent flexible conducting polymer electrode and a second conducting polymer contact.

13. The heterojunction device of any of claims 1 through 4 where the acceptor is a fullerene or a polymer comprising a fullerene.

14. The heterojunction of any of claims 1 through 4 where the acceptor is a polymer selected from polyquinoline or a derivative of polyquinoline.

15. An optical memory unit comprising a heterojunction structure according to any of claims 1 through 4.

* * * * *

UNITED STATES PATENT AND TRADEMARK OFFICE
CERTIFICATE OF CORRECTION

PATENT NO. : 5,331,183
DATED : July 19, 1994
INVENTOR(S) : N.S. Sariciftci and Alan J. Heeger It is certified that error appears in the above-indentified patent and that said Letters Patent is hereby corrected as shown below:

```
                          after the title, and before the paragraph
entitled "Field of the Invention", please insert the following heading
and paragraph:
         Column 1, line 1,
    --     Reference to Government Support
         This invention was made in part with Government support
under contract number N00014-91-J-1235 awarded by the Office of
Naval Research.  The Government has certain rights in this
invention.  --
```

Signed and Sealed this

Eighteenth Day of July, 1995

Attest:

BRUCE LEHMAN

*Attesting Officer*   *Commissioner of Patents and Trademarks*